United States Patent
Brown et al.

(10) Patent No.: US 8,055,467 B2
(45) Date of Patent: Nov. 8, 2011

(54) METHOD OF GENERATING A RESTRICTED INLINE RESISTIVE FAULT PATTERN AND A TEST PATTERN GENERATOR

(75) Inventors: Jeff S. Brown, Fort Collins, CO (US); Marek Marasch, Longmont, CO (US); John Gatt, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 426 days.

(21) Appl. No.: 12/337,398

(22) Filed: Dec. 17, 2008

(65) Prior Publication Data
US 2010/0153056 A1  Jun. 17, 2010

(51) Int. Cl.
*G06F 19/00* (2011.01)
*G01R 31/00* (2006.01)

(52) U.S. Cl. .................. 702/123; 324/762.02

(58) Field of Classification Search .................. 702/123, 702/117; 324/765, 762.02, 158.1, 765.01; 716/4
See application file for complete search history.

(56) References Cited

U.S. PATENT DOCUMENTS
2005/0240887 A1* 10/2005 Rajski et al. ............. 716/4
2008/0211531 A1*  9/2008 Gattiker et al. ............ 324/765
* cited by examiner Primary Examiner — Bryan Bui

(57) ABSTRACT

A method of generating an IRF pattern for testing an IC and a test pattern generator are disclosed. In one embodiment, the method includes: (1) identifying a path of the integrated circuit for inline resistive fault pattern generation, (2) determining if the path is a minimal slack path of the IC and (3) generating, when the path is the minimal slack path, a restricted inline resistive fault pattern for the path using only a capture polarity having a minimal inherent margin.

18 Claims, 3 Drawing Sheets

METHOD OF GENERATING A RESTRICTED INLINE RESISTIVE FAULT PATTERN AND A TEST PATTERN GENERATOR

TECHNICAL FIELD

This application is directed, in general, to at-speed testing of integrated circuits (ICs) and, more specifically, to generating in-line resistive fault (IRF) patterns for at-speed testing of ICs.

BACKGROUND

Semiconductor manufacturers perform a series of tests to detect faults in manufactured ICs. Some of the defects, such as line resistive vias and bridges, can be effectively caught by conducting testing at the functional speed of the IC. Automatic Test Pattern Generation (ATPG) tools can provide fault models that can be used to generate tests for detecting at-speed failures. An ATPG tool is often used to generate a test pattern (an input or test sequence) that, when applied to an IC, allows a tester to determine between correct circuit behavior and faulty circuit behavior caused by defects.

The generated test patterns for at-speed testing require a first part that launches a logic transition value along a path and a second part that captures the response at a particular time based on the clock speed of the system. In a typical synchronous design style, the logic transition value is applied ("launched") at a launch flip-flop of the path and retrieved ("captured") at a capture flip-flop of the path. Located between the launch flip-flop and the capture flip-flop of the path is combinational logic.

Inline resistive fault (IRF) pattern generation is an example of a test pattern generated for at-speed testing of an IC. IRF pattern generation is used to create at-speed scan based testing patterns to launch data from one register (i.e., the launch flip-flop) and capture the data at the next register (i.e., the capture flip-flop) while operating the IC at or close to the functional speed. IRF patterns test one polarity of data transitioning through the path so at the capture register (or capture flip-flop) data will either be rising or falling, but both directions are not tested.

Due to the manner in which storage elements are characterized in a cell library, IRF patterns may be generated that allow setup times to be missed and the capture flip-flop still capture data. Setup time is understood as the amount of time needed for an input data signal to precede the arrival of the clock signal at a clocked element and result in a known clock to output delay value. Setup time is not a timing requirement for a storage element to successfully capture arriving data. A storage element may still capture data when the setup time is missed, but the magnitude of the setup time miss can vary greatly between if rising or falling data is arriving at the storage element. Since data may still be captured even when setup times are missed, the results of IRF testing may be flawed. As such, improved IRF testing would be beneficial in the art.

SUMMARY

One aspect provides a method of generating an IRF pattern for testing an IC. In one embodiment, the method includes: (1) identifying a path of the integrated circuit for inline resistive fault pattern generation, (2) determining if the path is a minimal slack path of the IC and (3) generating, when the path is the minimal slack path, a restricted inline resistive fault pattern for the path using only a capture polarity having a minimal inherent margin.

In another aspect, a test pattern generator for generating test patterns for at-speed testing of an IC is disclosed. In one embodiment, the test pattern generator includes: (1) an IC path selector configured to identify a path of the integrated circuit for inline resistive fault pattern generation and (2) a restricted inline resistive fault pattern generator configured to determine if the path is a minimal slack path of the integrated circuit and generate, when the path is the minimal slack path, a restricted inline resistive fault pattern for the path using only a capture polarity having a minimal inherent margin.

BRIEF DESCRIPTION

Reference is now made to the following descriptions taken in conjunction with the accompanying drawings, in which.

DETAILED DESCRIPTION

Disclosed herein is an improved method for generating an IRE pattern that includes restricting the pattern generation to using the capture polarity that has a minimal inherent margin. The data polarity associated with the minimal inherent margin for a storage element is the polarity of arrival data which the storage element fails to capture the soonest after the setup time is missed. Therefore, unlike traditional IRF pattern generation, the disclosed method generates IRF patterns for IC paths according to the polarity direction of the capture data. Thus, the disclosed method considers the inherent margin that is added to at-speed tests by storage elements of the IC paths (e.g., capture flip-flops) and reduces the errors of IRF test results related to the ability of the storage elements to capture data while missing the setup time of the storage element.

Figure 1:
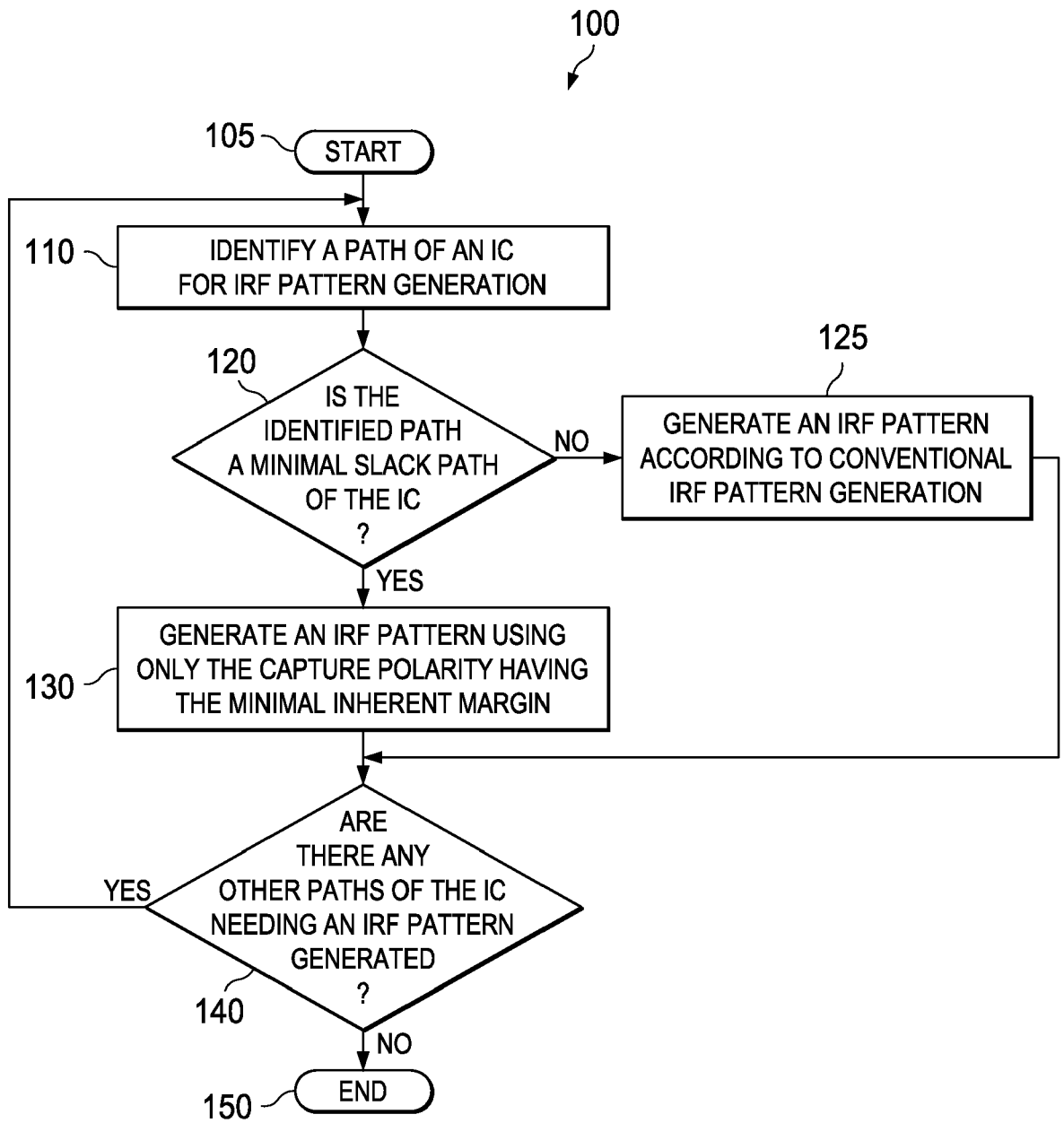
FIG. 1 is a flow diagram of an embodiment of a method of generating an IRF pattern according to the principles of the present invention.

FIG. 1 is a flow diagram of an embodiment of a method 100 of generating an IRF pattern according to the principles of the present invention. At least part of the method 100 may be carried out employing an ATPG tool. The method begins in a step 105.

After beginning, a path of an IC is identified for IRF pattern generation in a step 110. The ATPG tool may be used to identify the path according to conventional testing procedures. In one embodiment, the path is a critical path of the IC.

After identifying the path, a determination is made in a first decisional step 120 if the identified path is a minimal slack path of the IC. Slack for the path is defined as the difference between the arrival time of test data at a capture flip-flop of the path compared to the arrival time of the clock at the capture flip-flop (i.e., capture clock). In one embodiment, a minimal slack path is determined based on a percentage of the maximum timing slack of the IC paths. For example, paths having a timing slack that is 10% or less of the maximum slack may be deemed as minimal slack paths. In another embodiment, a minimal slack path may be determined based on a comparison to the timing slacks of other IC paths. For example, the IC paths may be ordered according to timing slack and the N IC paths having the smallest timing slack may be deemed minimal slack paths, wherein N is a positive integer greater than zero. Since a critical path would have a timing slack of zero, a critical path is a minimal slack path.

If the identified path is a minimal slack path, then an IRF pattern is generated in a step 130 using only the capture polarity having the minimal inherent margin. The method 100, therefore, generates an IRF pattern restricted (i.e., a restricted IRF pattern) to the capture polarity with the minimal inherent margin. The data polarity associated with the minimal inherent margin is the polarity of arrival data which the flip-flop fails to capture the soonest after the setup time is missed. Thus, the method 100 recognizes that the magnitude of the setup time miss that a flip-flop can tolerate for successful latching may vary widely depending on if the data is high or low. In other words, the ability to capture data after the setup time is missed for a flip-flop can differ depending on if the data is high or low. For example, a typical 65 nm flip-flop may miss the setup time for rising input data by 36 ps and still latch data, but falling data can miss the setup time by 120 ps and still capture the data. In contrast, IRF patterns for conventional IRF testing are not generated considering what the data polarity at the capture flip-flop means in terms of the inherent margin that is being added to the at-speed test.

As such, if the capture flip-flop was the flip-flop in the above example, then the capture polarity used for pattern generation would be high since the inherent margin for rising input data is 36 ps compared to 120 ps for falling input data. The minimal inherent margin, therefore, would be 36 ps. After generating the IRF pattern using only the capture polarity having the minimal inherent margin, a determination is made in a second decisional step 140 if there are other paths of the IC needing an IRF pattern generated. If so, the method continues to step 110. If not, the method ends in a step 150.

Returning now to the first decisional step 120, if the identified path is not a minimal slack path, then the method 100 generates an IRF pattern in a step 125 according to conventional IRF pattern generation where there is no restriction (i.e., a non-restricted IRF pattern) to using the capture polarity having the minimal inherent margin. After step 125, the method continues to step 140.

Figure 2:
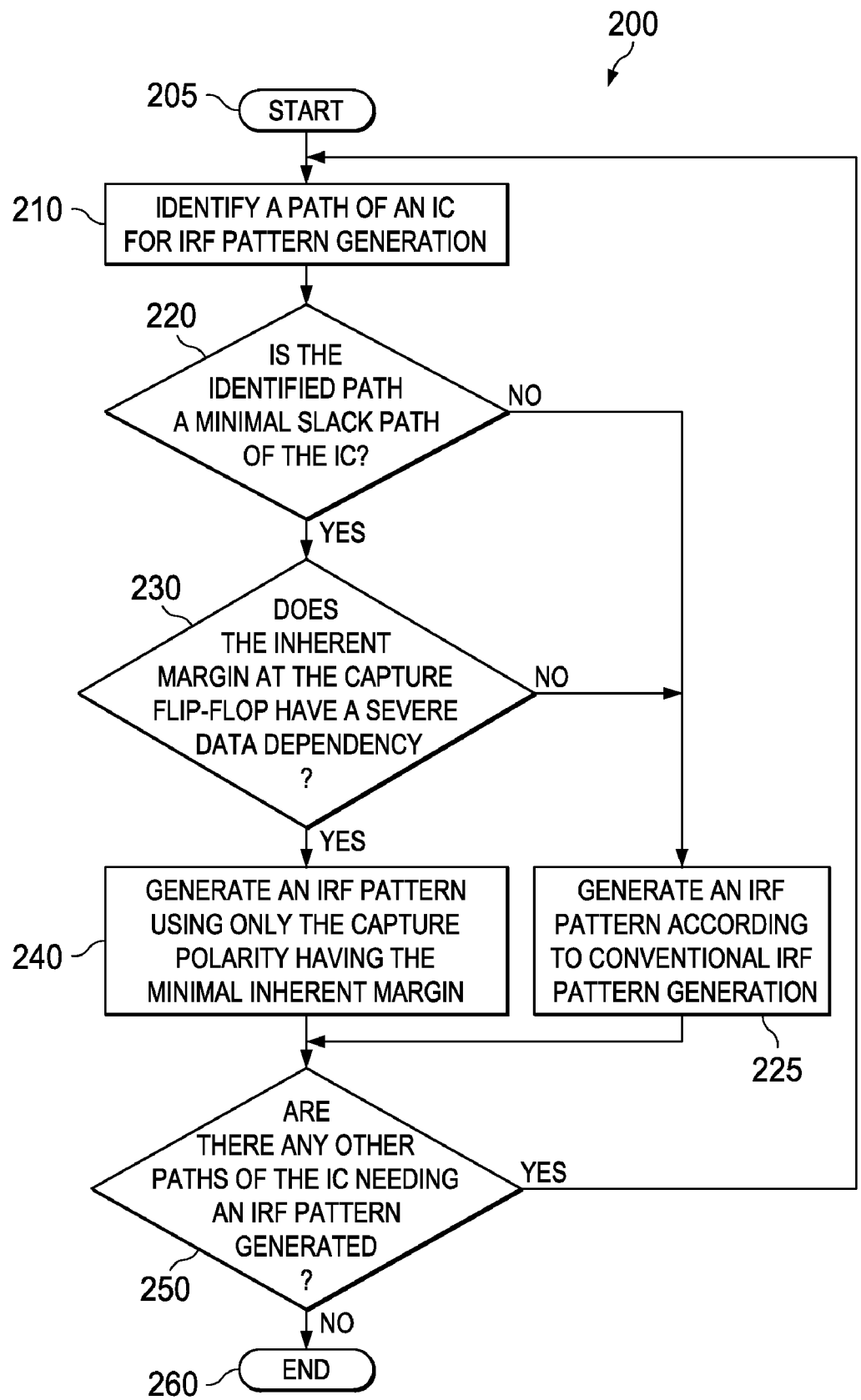
FIG. 2 is a flow diagram of another embodiment of a method of generating an IRF pattern according to the principles of the present invention.

FIG. 2 is a flow diagram of another embodiment of a method 200 of generating an IRF pattern according to the principles of the present invention. The method 200 may also employ an ATPG tool (e.g., a conventional ATPG tool for generating traditional fault patterns) for carrying out at least part of the steps. The method begins in a step 205.

After beginning, a path of an IC is identified for IRF pattern generation in a step 210. After identifying the path, a determination is made in a first decisional step 220 if the identified path is a minimal slack path of the IC.

If the identified path is a minimal slack path, then a determination is made in a second decisional step 230 if the inherent margin at the capture flip-flop has a severe data dependency. A severe data dependency is based on the difference between the rising and falling inherent margins for capturing data when the setup time is missed. If the inherent margins for the two different polarities differ by more than a designated margin, then the flip-flop is deemed to have a severe data dependency. In one example, flip-flops showing a greater than 10% difference between the inherent margin for capturing rising data versus the inherent margin for capturing falling data are deemed to have a severe data dependency for the inherent margin and may be chosen to be analyzed in this manner when they are used in the IC. If the inherent margin has severe data dependency, then an IRF pattern is generated in a step 240 using only the capture polarity having the minimal inherent margin. After generating the IRF pattern using only the capture polarity having the minimal inherent margin, a determination is made in a second decisional step 250 if there are other paths of the IC needing an IRF pattern generated. If so, the method continues to step 210. If not, the method ends in a step 260.

Returning now to the first decisional step 220, if the identified path is not a minimal slack path, then the method 200 generates an IRF pattern in a step 225 according to conventional IRF pattern generation. After step 225, the method continues to step 250. Returning now to the second decisional step 230, if the inherent margin for the capture flip-flop does not have severe data dependency, then the method 200 continues to the step 225 and generates an IRF pattern according to conventional IRF pattern generation.

Figure 3:
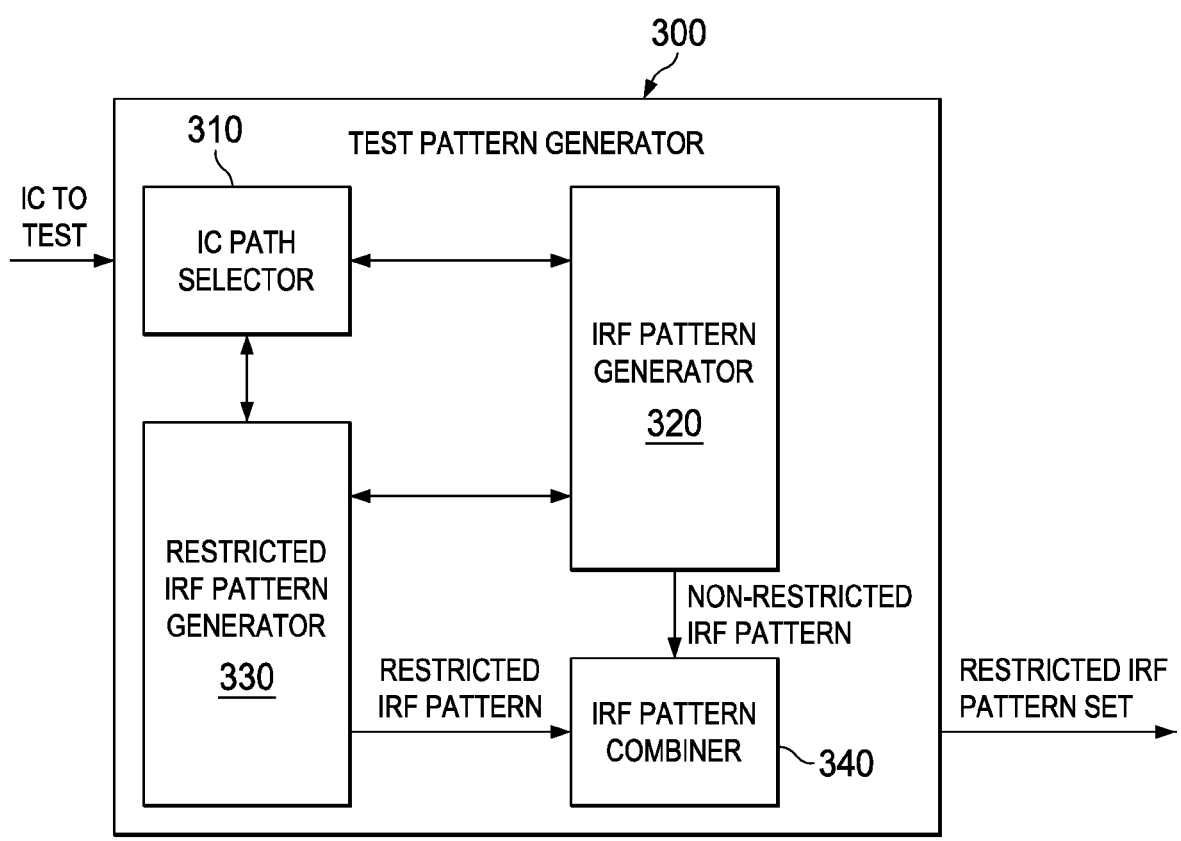
FIG. 3 is a block diagram of a test pattern generator constructed according to the principles of the present invention.

FIG. 3 is a block diagram of a test pattern generator 300 constructed according to the principles of the present invention. The test pattern generator 300 is configured to generate test patterns for at-speed testing of ICs. The test pattern generator 300 may be implemented in hardware, firmware, software, or any combination thereof. In one embodiment, the test pattern generator 300 may be a set of algorithms represented by a series of operating instructions stored on a memory of a computer that direct the operation of the computer. The test pattern generator 300 may include a conventional ATPG tool that is used to generate at least a portion of the test patterns.

The test pattern generator 300 includes an IC path selector 310, an IRF pattern generator 320, a restricted IRF pattern generator 330 and an IRF pattern combiner 340. The IC path selector 310 is configured to identify a particular path of the IC for generating an IRF test pattern. The IC path selector 310 may receive a design of the IC for pattern generation for the test pattern generator 300. The IC design may be input via a user's interface or loaded from an IC design tool.

The identified path may be a critical path of the IC. The IC path selector 310 may identify multiple paths of the IC for generating an IRF test pattern. The IC path selector 310 may employ the conventional ATPG tool to identify paths of the IC.

The IRF pattern generator 320 may also employ the ATPG tool. The IRF pattern generator 320 is configured to generate traditional IRF test patterns for paths of the IC. In one embodiment, the IRF pattern generator 320 is configured to generate traditional IRF test patterns for those paths that are not classified as minimal slack paths. The restricted IRF pattern generator 330 may determine if the paths are minimal slack paths. In another embodiment, the IRF pattern generator 320 may be configured to generate traditional IRF test patterns for those paths that are classified as minimal slack paths but do not have severe data dependent inherent margin requirements at the capture flip-flop. The restricted IRF pattern generator 330 may determine if the paths are minimal slack paths and if severe data dependency for the inherent margin requirements exists at the capture flip-flop. Thus, which paths the IRF pattern generator 320 provides test patterns for may rely on the determinations made by the restricted IRF pattern generator 330.

The restricted IRF pattern generator 330 is configured to generate IRF test patterns using only the capture polarity having a minimal inherent margin. In one embodiment, the restricted IRF pattern generator 330 is configured to generate IRF test patterns based on capture polarity when the identified paths are minimal slack paths. In another embodiment, the restricted IRF pattern generator 330 is configured to generate IRF test patterns based on capture polarity when the identified paths are minimal slack paths and the inherent margin requirements for the capture flip-flop of the path are severely data dependent. As noted above, the restricted IRF pattern generator 330 is configured to determine if a path is a minimal slack path and is configured to determine if a capture flip-flop has severe data dependent inherent margin requirements.

The IRF pattern combiner 340 is configured to provide a restricted IRF pattern set for the test pattern generator 300. The IRF pattern combiner 340 may receive IRF test patterns from the IRF pattern generator 320 and restricted IRF test patterns from the restricted IRF pattern generator 330. The IRF pattern combiner 340 may organize and combine the two types of test patterns to provide the restricted IRF pattern set.

The above-described methods may be embodied in or performed by various conventional digital data processors or computers, wherein the computers are programmed or store executable programs of sequences of software instructions to perform one or more of the steps of the methods, e.g., steps of the method of FIG. 1 or 2. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, e.g., one or more of the steps of the method of FIG. 1 or 2. Additionally, an apparatus, such as dedicated test equipment, may be designed to include the necessary circuitry to perform each step of the methods of FIGS. 1 or 2.

Those skilled in the art to which this application relates will appreciate that other and further additions, deletions, substitutions and modifications may be made to the described embodiments.

What is claimed is:

1. A method of generating an inline resistive fault pattern for testing an integrated circuit, comprising:
   identifying a path of said integrated circuit for inline resistive fault pattern generation;
   determining if said path is a minimal slack path of said IC; and
   generating, when said path is said minimal slack path, a restricted inline resistive fault pattern for said path using only a capture polarity having a minimal inherent margin, wherein each step of said method is performed by a processor.

2. The method as recited in claim 1 further comprising determining if a capture storage element of said path has severe data dependent inherent margin when said path is said minimal slack path.

3. The method as recited in claim 2 wherein said generating said restricted inline resistive fault pattern occurs when said path is said minimal slack path and said capture storage element has said severe data dependent inherent margin.

4. The method as recited in claim 1 further comprising generating, when said path is not a minimal slack path, an inline resistive fault pattern that is not restricted to using only said capture polarity having said minimal inherent margin.

5. The method as recited in claim 2 further comprising generating an inline resistive fault pattern that is not restricted to using only said capture polarity having said minimal inherent margin when said path is said minimal slack path and said capture storage element does not have said severe data dependent inherent margin.

6. The method as recited in claim 1 wherein said minimal slack path is a critical path of said IC.

7. The method as recited in claim 2 wherein said capture storage element has said severe data dependent inherent margin when a difference between a timing requirement for capturing falling data and a timing requirement for capturing rising data differs by 10% or more.

8. The method as recited in claim 2 wherein said capture storage element has said severe data dependent timing requirements for capturing data of said polarity when said minimal inherent margin is about 10% less than the timing requirement for said capture storage element to capture data having a opposite polarity of said polarity.

9. The method as recited in claim 1 further comprising providing a restricted inline resistive fault pattern set including said restricted inline resistive fault pattern.

10. A test pattern generator for generating test patterns for at-speed testing of an integrated circuit, comprising:
    an IC path selector configured to identify a path of said integrated circuit for inline resistive fault pattern generation;
    a restricted inline resistive fault pattern generator configured to determine if said path is a minimal slack path of said integrated circuit and generate, when said path is said minimal slack path, a restricted inline resistive fault pattern for said path using only a capture polarity having a minimal inherent margin.

11. The test pattern generator as recited in claim 10 wherein said restricted inline resistive fault pattern generator is further configured to determine if a capture storage element of said path has severe data dependent timing requirements for capturing data when said path is said minimal slack path.

12. The test pattern generator as recited in claim 11 wherein said restricted inline resistive fault pattern generator is further configured to generate said restricted inline resistive fault pattern when said path is said minimal slack path and said capture storage element has said severe data dependent timing requirements for capturing data.

13. The test pattern generator as recited in claim 10 further comprising an inline resistive fault pattern generator configured to generate, when said path is not a minimal slack path, an inline resistive fault pattern that is not restricted to using only said capture polarity having said minimal inherent margin.

14. The test pattern generator as recited in claim 11 further comprising an inline resistive fault pattern generator configured to generate an inline resistive fault pattern that is not restricted to using only said capture polarity having said minimal inherent margin when said path is said minimal slack path and said capture storage element does not have said severe data dependent timing requirements for capturing data.

15. The test pattern generator as recited in claim 10 wherein said minimal slack path is a critical path of said IC.

16. The test pattern generator as recited in claim 11 wherein said capture storage element has said severe data dependent timing requirements for capturing data when a difference between a timing requirement for capturing falling data and a timing requirement for capturing rising data is 10% or greater.

17. The test pattern generator as recited in claim 11 wherein said capture storage element has said severe data dependent timing requirements for capturing data of said polarity when said minimal inherent margin is about 10% less than a timing requirement for said capture storage element to capture data having an opposite polarity of said polarity.

18. The test pattern generator as recited in claim 10 further comprising an inline resistive fault pattern combiner configured to provide a restricted inline resistive fault pattern set including said restricted inline resistive fault pattern.

* * * * *